United States Patent
Jow

(10) Patent No.: US 7,977,759 B2
(45) Date of Patent: Jul. 12, 2011

(54) FINGERPRINT SENSOR CHIP PACKAGE METHOD AND THE PACKAGE STRUCTURE THEREOF

(76) Inventor: En-Min Jow, Hsinchu (TW)

(*) Notice: Subject to any disclaimer, the term of this patent is extended or adjusted under 35 U.S.C. 154(b) by 146 days.

(21) Appl. No.: 12/547,767

(22) Filed: Aug. 26, 2009

(65) Prior Publication Data
US 2010/0258891 A1    Oct. 14, 2010

(30) Foreign Application Priority Data
Apr. 9, 2009 (TW) ................. 97133856 A

(51) Int. Cl.
H01L 31/0203 (2006.01)
H01L 21/00 (2006.01)
(52) U.S. Cl. ......... 257/433; 257/E21.499; 257/E31.119; 438/64
(58) Field of Classification Search ................. 438/64; 257/433, E21.499, E31.119
See application file for complete search history.

(56) References Cited

U.S. PATENT DOCUMENTS
2004/0104458 A1 * 6/2004 Tsukada et al. ............... 257/669
* cited by examiner

*Primary Examiner* — Matthew W Such
*Assistant Examiner* — Monica D Harrison
(74) *Attorney, Agent, or Firm* — Rosenberg, Klein & Lee

(57) ABSTRACT

A fingerprint sensor chip package method and the package structure thereof are disclosed. The invention includes: providing a substrate; arranging a sensor chip on the substrate, with an active surface of the sensor chip facing upward; forming a patterned conductive colloid on the sensor chip, wherein the patterned conductive colloid extends from the periphery of the active surface of the sensor chip along the side wall of the sensor and electrically connects with the circuit layer of the substrate; forming a non-conductive film to cover the sensor chip, the patterned conductive colloid and a portion of the substrate; and forming a conductive film on the non-conductive film. The patterned conductive colloid replaces the conventional bond wires to improve the product yield and to omit the molding process. The conductive film is electrically connected with the grounding point/area on the substrate to dissipate the static charges for protecting the chip.

14 Claims, 3 Drawing Sheets

FINGERPRINT SENSOR CHIP PACKAGE METHOD AND THE PACKAGE STRUCTURE THEREOF

BACKGROUND OF THE INVENTION

1. Field of the Invention

The present invention relates to a semiconductor chip package method and the package structure thereof, and more particularly, to a fingerprint sensor chip package method and the package structure thereof.

2. Description of the Prior Art

Chip fabrication methods provided in the semiconductor fabrication field often need to take the electrical property of a chip into consideration and arrange the chip in a package through package procedures to avoid any possible destruction by external forces such as pressure and electrostatics.

However, some newly developed chip applications require the chip surface to be exposed to the environment. For example, a finger print sensor needs to provide a chip surface to be touched by a finger when reading the pattern of a finger for identification.

FIG. 1 shows the package structure of a touch sensing fingerprint recognition device 100 of a prior art. It mainly includes a substrate 110, a semiconductor chip 120, a plurality of bond wires 130 and an encapsulating colloid 140. The back of the semiconductor chip 120 is affixed to the upper surface 111 of the substrate 110, and the semiconductor chip 120 is electrically connected with the substrate 110 via bond wires 130. The substrate 110 under the semiconductor chip 120 becomes a media for mechanical and electrical connections. In order to encapsulate bond wires 130, encapsulating colloid 140 covers a portion of the periphery of the active surface 121 and the side wall of the semiconductor chip, with the sensing area 123 on the active surface 121 exposed; and therefore, the fitting of the mold when forming encapsulating colloid is very important. Besides, wire bond yields and whether bond wires 130 are affected by moldflow during forming encapsulating colloid are also important factors.

SUMMARY OF THE INVENTION

In order to solve aforementioned problems, an objective of the present invention is to provide a package method of a fingerprint sensor chip and the package structure thereof which replaces metal bond wires of the prior art with a conductive colloid to improve product yields, reduce the thickness of the package, and omit press molding of the prior art. In addition, the conductive colloid is connected with the ground line on the substrate to dissipate the static charges and protect the chip.

In order to achieve aforementioned objectives, one embodiment of the present invention propose a fingerprint sensor chip package method including: providing a substrate having a circuit layer thereon; arranging a sensor chip on the substrate, wherein an active surface of the sensor chip faces upward; forming a patterned conductive colloid on the sensor chip, wherein the patterned conductive colloid extends from the periphery of the active surface of the sensor chip along the side wall of the sensor chip and electrically connects with the circuit layer of the substrate; forming a non-conductive film to cover the sensor chip, the patterned conductive colloid and a portion of the substrate; and forming a conductive film on the non-conductive film.

Another embodiment of the present invention discloses a fingerprint sensor chip package structure including: a substrate having a circuit layer thereon; a sensor chip arranged on the substrate, wherein an active surface of the sensor chip faces upward; a patterned conductive colloid formed on the sensor chip, wherein the patterned conductive colloid extends from the periphery of the active surface of the sensor chip along the side wall of the sensor chip and electrically connects with the circuit layer of the substrate; a non-conductive film formed to cover the sensor chip, the patterned conductive colloid and a portion of the substrate; and a conductive film formed on the non-conductive film.

Below, the embodiments are described in detail in cooperation with the attached drawings to make easily understood the objectives, technical contents, characteristics and accomplishments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF THE INVENTION

The present invention is described with the embodiments below. However, it should be understood that the embodiments are only to exemplify the present invention but not to limit the scope of the present invention.

Figure 1:
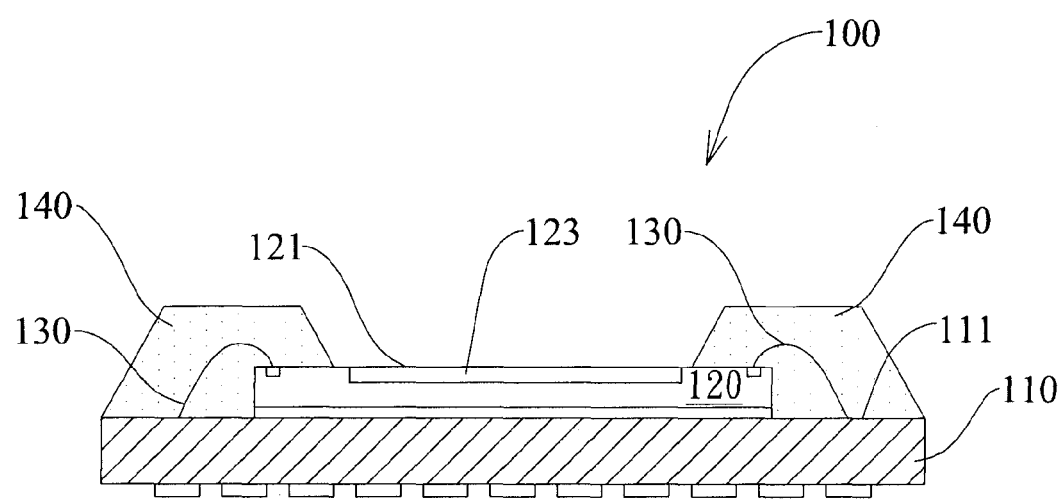
FIG. 1 is a diagram schematically illustrating the package structure of a conventional touch sensing fingerprint recognition device.
Figure 2A:
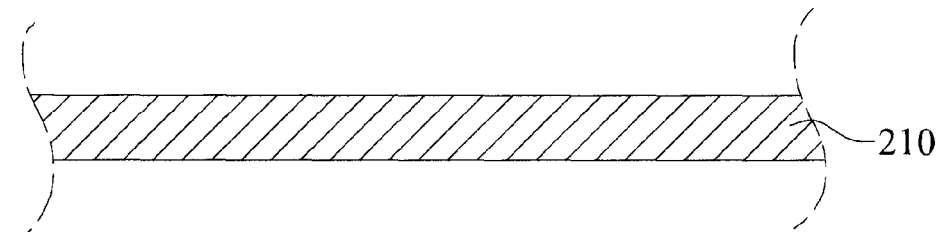
FIG. 2a to FIG. 2e are diagrams schematically showing the cross-sectional views of the structure at each step of the fingerprint sensor chip package method according to one embodiment of the present invention.
Figure 2B:
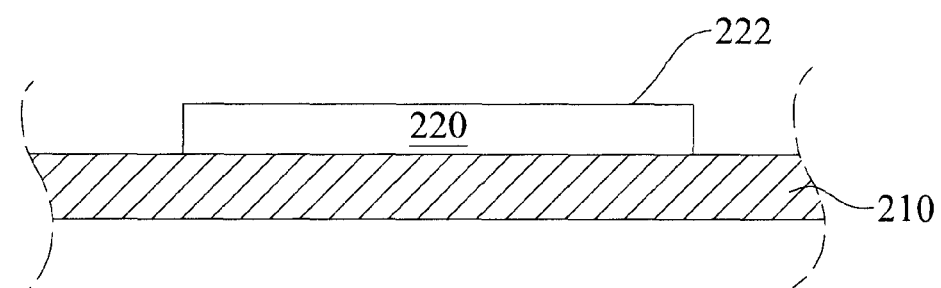
Figure 2C:
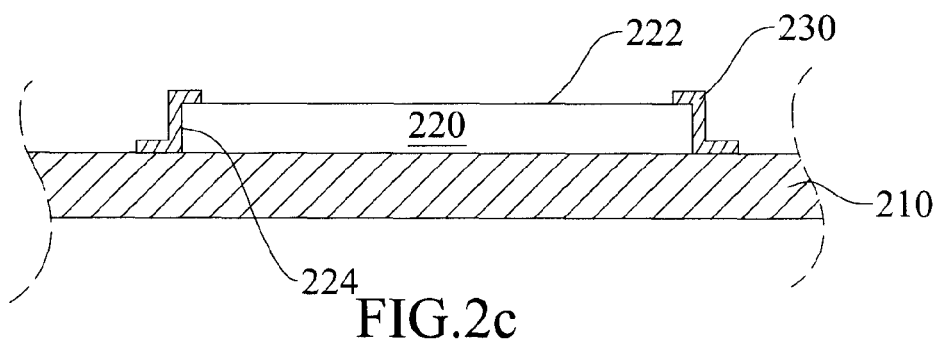
Figure 2D:
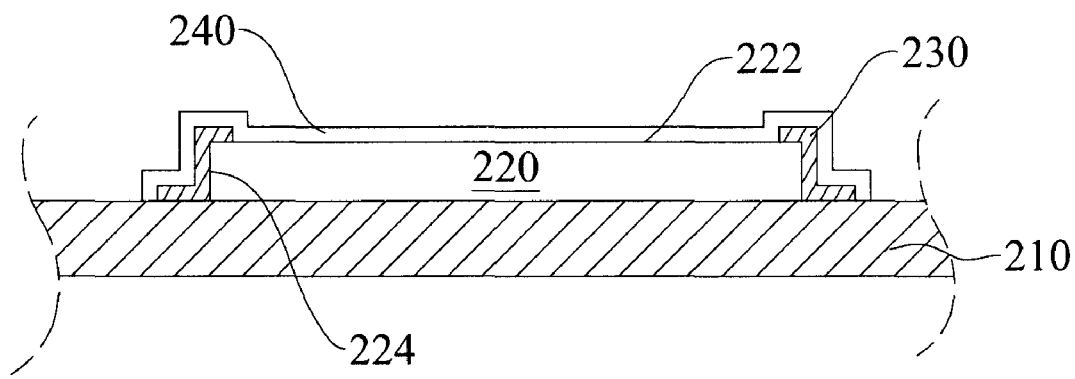
Figure 2E:
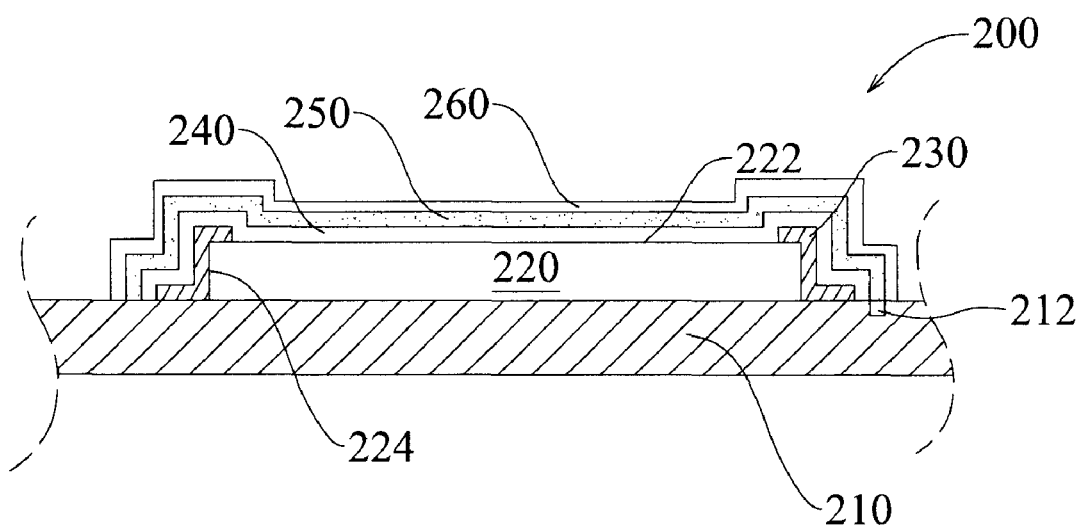

Please referring to FIG. 2a to FIG. 2e, they present the cross-sectional views of the structure at each step of the fingerprint sensor chip package method of the present invention. The fingerprint sensor chip package method includes the following steps. First, referring to FIG. 2a, a substrate 210 having a circuit layer (not shown in the figure) thereon is provided. Referring to FIG. 2b, a sensor chip 220 is arranged on the substrate 210, wherein the active surface 222 of the sensor chip 220 faces upward. In one embodiment, the sensor chip 220 can be affixed to the substrate 210 by adhesives. Next, referring to FIG. 2c, a patterned conductive colloid 230 is formed on the sensor chip 220, wherein the conductive colloid layer 230 extends downwardly from the periphery of the active surface 222 along the side wall 224 of the sensor chip 220, and connects with the circuit layer on the substrate 210 electrically. Next, as illustrated in FIG. 2d, in order to protect chip 220 from being polluted by sweat of a user or destructed by external forces, a non-conductive film 240 is formed to cover the sensor chip 220, the patterned conductive colloid 230 and a portion of the substrate 210. Then, as illustrated in FIG. 2e, a conductive film 250 is formed on the non-conductive thin film 240.

In continuation to the above descriptions, in one embodiment, the patterned conductive colloid 230 can be formed by molding or coating on the periphery of the active surface 222 of the sensor chip 220. In another embodiment, a non-conductive film 240 and/or conductive film 250 are formed by vapor deposition, printing or spraying. To provide better grounding effects, a ground point 212 or a ground area is set on the substrate 210, and the area including the ground location is covered during the formation of the conductive film for connection, to avoid the damages to the semiconductor components caused by electrostatic discharge (ESD). Moreover, the molding process for encapsulating bond wires of the prior art is omitted, which avoids forming bumps on the two ends of the fingerprint sensor chip, and achieves more even contact surface.

Please continue to refer to FIG. 2e. The fingerprint sensor chip package structure 200 of another embodiment of the present invention includes: a substrate 210 having a circuit layer (not shown in the figure); a sensor chip 220 arranged on the substrate 210, wherein the active surface 222 of the sensor chip 220 faces upward; a patterned conductive colloid 230, formed on the sensor chip 220, wherein the patterned conductive colloid 230 extends downwardly from the periphery of the active surface 222 of the sensor chip 220 along the side wall 224 of the sensor chip 220, and is electrically connected with the circuit layer on the substrate 210, and the patterned conductive colloid 230 is formed around the periphery of the active surface 222 of the sensor chip 220 with the sensing area exposed; a non-conductive film 240 formed to cover sensor chip 220, patterned conductive colloid 230 and a portion of the substrate 210; and a conductive film 250 formed on the non-conductive film 240.

In continuation to the aforementioned description, the material of the substrate 210 includes metal, glass, ceramic or composite materials. In one embodiment, the patterned conductive colloid 230 includes silver epoxy material or other conductive colloid for connecting the sensor chip 220 and the substrate 210 electrically, which improves the yield issue caused by wire bonding. Moreover, employing the patterned conductive colloid 230 reduces the overall thickness, and provides a lighter, thinner and smaller product. The sensor chip 220 includes a plurality of conductive points set along the periphery of the active surface 222. The patterned colloid layer 230 electrically connects the circuit layer on the substrate 210 with the conductive points.

In continuation to the description, in the fingerprint sensor chip package structure of the present embodiment, the non-conductive film 240 includes plastic or high molecule material to protect the sensor chip and the circuit or conductive points thereon. In one embodiment, the thickness of the non-conductive film 240 ranges from 0.1 to 5 µm. In addition, the conductive film 250 includes metal material. In one embodiment, the conductive film 250 can facilitate ground connection, and in addition, in order for the conductive film 250 to prevent damages caused by long term user touching, it should be resilient to scratches and corrosion. Therefore, in one embodiment, the conductive film includes titanium and alloy thereof. In one embodiment, the conductive film 250 is electrically connected with the conductive point or area on the substrate 210 to dissipate the static charges for protecting the chip. In another embodiment, to provide better protection for the package structure, a non-conductive film 260 formed on the conductive film 250 is further included to provide protection from corrosion and wearing down, as shown in FIG. 2e.

In summary, the present invention provides a fingerprint sensor chip package method and the package structure thereof by replacing metal wires of the prior art with conductive colloids to improve product yields and reduce package thickness. Besides, the molding process of the prior art is omitted to acquire more even surface. Moreover, static charges are dissipated by connecting the ground wire of the substrate via the conductive film to protect the chip.

The embodiments described above are to demonstrate the technical contents and characteristics of the present invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. A fingerprint sensor chip package method comprising:
providing a substrate having a circuit layer thereon;
arranging a sensor chip on said substrate, wherein an active surface of said sensor chip faces upward;
forming a patterned conductive colloid on said sensor chip, wherein said patterned conductive colloid extends from the periphery of said active surface of said sensor chip along the side wall of said sensor chip and electrically connects with said circuit layer of said substrate;
forming a non-conductive film to cover said sensor chip, said patterned conductive colloid and a portion of said substrate; and
forming a conductive film on said non-conductive film.

2. The fingerprint sensor chip package method according to claim 1, wherein the method of forming said patterned conductive colloid can be molding or coating.

3. The fingerprint sensor chip package method according to claim 1, wherein the method of forming said non-conductive film can be vapor deposition, printing or spraying.

4. The fingerprint sensor chip package method according to claim 1, wherein the method of forming said conductive film can be vapor deposition, printing or spraying.

5. The fingerprint sensor chip package method according to claim 1, further comprising setting a ground point or a ground area on said substrate, and electrically connecting said conductive film with said ground point or said ground area.

6. A fingerprint sensor chip package structure comprising:
a substrate having a circuit layer thereon;
a sensor chip arranged on said substrate, wherein an active surface of said sensor chip faces upward;
a patterned conductive colloid formed on said sensor chip, wherein said patterned conductive colloid extends from the periphery of said active surface of said sensor chip along the side wall of said sensor chip and electrically connects with said circuit layer of said substrate;
a non-conductive film formed to cover said sensor chip, said patterned conductive colloid and a portion of said substrate; and
a conductive film formed on said non-conductive film.

7. The fingerprint sensor chip package structure according to claim 6, wherein said patterned conductive colloid comprises silver epoxy material.

8. The fingerprint sensor chip package structure according to claim 6, wherein said non-conductive film comprises plastic or polymeric material.

9. The fingerprint sensor chip package structure according to claim 6, wherein said conductive film comprises metal material.

10. The fingerprint sensor chip package structure according to claim 6, wherein said conductive film comprises titanium and alloy thereof.

11. The fingerprint sensor chip package structure according to claim 6, wherein said sensor chip has a plurality of conductive points set along the periphery of said active surface.

12. The fingerprint sensor chip package structure according to claim 11, wherein said patterned conductive colloid electrically connect said conductive points with said circuit layer on said substrate.

13. The fingerprint sensor chip package structure according to claim 6, wherein the width of said non-conductive film ranges from 0.1 µm to 5 µm.

14. The fingerprint sensor chip package structure according to claim 6, wherein said conductive film is electrically connected with a ground point or a ground area on said substrate.

* * * * *